(12) United States Patent
Grams et al.

(10) Patent No.: US 6,497,837 B2
(45) Date of Patent: Dec. 24, 2002

(54) METHOD USING A SAW TOOTH MOLD

(75) Inventors: Gary O. Grams, Ankeny, IA (US);
Greg S. Peterson, Nevada, IA (US)

(73) Assignee: Accu-Mold Corp., Ankeny, IA (US)

( * ) Notice: Subject to any disclaimer, the term of this patent is extended or adjusted under 35 U.S.C. 154(b) by 163 days.

(21) Appl. No.: 09/785,746

(22) Filed: Feb. 20, 2001

(65) Prior Publication Data

US 2001/0007379 A1 Jul. 12, 2001

Related U.S. Application Data

(62) Division of application No. 09/351,232, filed on Jul. 12, 1999, now Pat. No. 6,305,921.

(51) Int. Cl.[7] .................. B29C 33/12; B29C 45/17; B29C 70/72
(52) U.S. Cl. ............... 264/272.15; 264/272.17; 264/277; 425/116; 425/125
(58) Field of Search .............. 264/272.11, 272.14, 264/272.15, 272.17, 275, 277, 263; 425/116, 122, 125, 129.1, 544; 249/95

(56) References Cited

U.S. PATENT DOCUMENTS

| | | | | |
|---|---|---|---|---|
| 4,314,960 A | * | 2/1982 | Hass | 264/272.15 |
| 4,453,903 A | * | 6/1984 | Pukaite | 249/95 |
| 4,490,902 A | * | 1/1985 | Eytcheson et al. | 257/670 |
| 5,118,271 A | * | 6/1992 | Baird et al. | 425/116 |
| 5,174,942 A | * | 12/1992 | Barnadas | 264/272.15 |
| 5,216,846 A | * | 6/1993 | Takahashi | 451/278 |
| 5,496,435 A | * | 3/1996 | Abbott | 156/232 |
| 5,637,273 A | * | 6/1997 | Goo | 264/272.15 |
| 5,682,673 A | * | 11/1997 | Fehr | 174/52.4 |
| 5,724,730 A | * | 3/1998 | Tanaka | 174/76 |
| 5,744,084 A | * | 4/1998 | Chia et al. | 264/272.15 |
| 5,837,567 A | * | 11/1998 | Tanaka et al. | 438/121 |
| 5,942,178 A | * | 8/1999 | Frechette et al. | 264/219 |
| 6,045,739 A | * | 4/2000 | Abe | 264/277 |

* cited by examiner

Primary Examiner—Angela Ortiz
(74) Attorney, Agent, or Firm—G. Brian Pingel; Camille L. Urban

(57) ABSTRACT

A method for molding integrated circuit packages including a semiconductor integrated circuit chip and a lead frame with a plurality of leads is disclosed. The method employs a device formed of top and bottom mold dies having intermating teeth that provide a sealed mold cavity around the integrated circuit chip and the lead frame leads. The teeth of at least one of said mold dies are formed with inclined surfaces that assist in compensating for any misalignment between the lead frame and the dies.

3 Claims, 6 Drawing Sheets

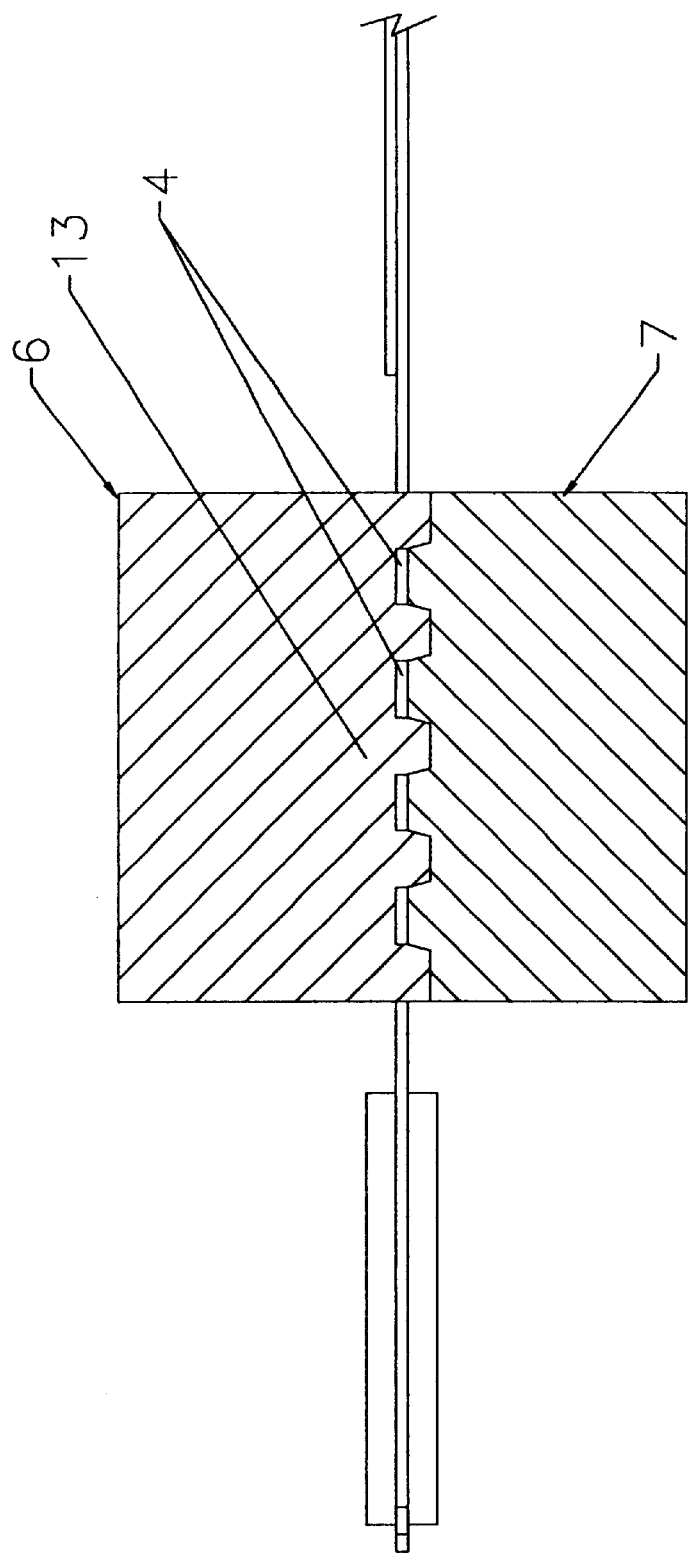

METHOD USING A SAW TOOTH MOLD

This is a division of Ser. No. 09/351,232 filed Jul. 12, 1999, now U.S. Pat. No. 6,305,921. The division is a result of a restriction requirement made in the aforementioned application on Jan. 12, 2001. This division is drawn to claims classified by the Examiner as Class 264 and subclass 272.15.

BACKGROUND OF THE INVENTION

1. Field of the Invention

The present invention relates in general to the production of integrated circuit packages and more specifically to a method for molding integrated circuit semiconductor devices using lead frames.

2. Description of the Prior Art

For many years, integrated circuit (IC) devices were formed with a semiconductor IC chip that is bonded to a lead frame and then encapsulated with thermoset plastic material. These types of IC devices performed effectively but were relatively expensive to produce.

In recent times, a variety of various alternatives to the thermoset plastic encapsulation devices have been developed as disclosed in U.S. Pat. Nos. 5,214,846; 5,637,273; 5,049,526; and 5,682,673. These patents describe various methods and means for producing a relatively inexpensive IC device in which the IC chip is encapsulated by a synthetic resin rather than thermoset plastic material. The encapsulation is used to protect the semiconductor chip from external impact to insure the internal circuitry thereof.

The resin encapsulation is performed by an injection molding process that can be carried out in a highly efficient and rapid molding process. However, because of the configuration of lead frames there are certain drawbacks to the use of injection molding in this fashion. The principal problem is that it is difficult to provide a molding cavity that is sufficiently sealed so as to prevent resin leakage or flash about the leads which causes a degradation in the appearance of the finished product as well as affecting its operability.

U.S. Pat. No. 5,637,273, discloses a means and method for molding integrated circuit packages through the use of a top or bottom mold die that includes projections that are sized so that their height is equal to the thickness of the lead frame leads. During the molding operation, the mold die projections are placed between the leads of the lead frame to assist in preventing leakage of resin during the molding operation. The patent further discloses the use of a tape that is placed on the leads of the lead frame to reduce the resin leaking pressure, which pressure causes the resin to leak out of the mold. Although the invention disclosed in the '273 Patent appears to be an improvement over prior art devices in reducing resin leakage from a mold, due to alignment problems that would most likely occur between the lead frame and the frame projections of the mold die, it seems highly likely that high speed molding operation of IC devices would not be practicable with such invention.

The present invention provides an improved method and means for allowing the high speed molding of IC devices formed by a resin injected molding process.

SUMMARY OF THE INVENTION

The present invention provides a method for using a particular injection mold for manufacturing a semiconductor device with a lead frame having a plurality of side leads. The method employs a mold formed of a top mold die and a bottom mold die, both dies including a central depression and peripheral side edges having spaced apart teeth aligned transversely to the depressions to form a series of alternating channels and projections. The teeth on one of the dies are formed with sidewalls having an inner lead enclosure portion that is sized to be equal to the thickness of the lead frame leads and an outer portion that is inclined toward the other sidewall, which results in the spacing between two adjacent teeth being wider at the outer ends of the teeth than at their inner ends. The top and bottom dies are aligned so that the projections of one fit into the channels of the other, and as they are brought into an abutting relationship the lead frame leads are guided into the lead enclosure portions to form a sealed mold cavity that extends around each of the leads to allow tighter mold die fit and reduce part flash.

A particular object and advantage of the present invention is that the inclined sidewalls of the teeth of the lower molds provide a compensating alignment mechanism for directing the lead frame leads into the channels between the lower portions of the teeth in a manner that significantly reduces pinching damage to the leads during the molding process as well as insert wear.

The foregoing and other advantages of the present invention will appear from the following description. In the description, reference is made to the accompanying drawings, which form a part hereof, and in which there is shown by illustration, and not of limitation, a specific form in which the invention may be embodied. Such embodiment does not represent the full scope of the invention, but rather the invention may be employed in a variety of embodiments, and reference is made to the claims herein for interpreting the breadth of the invention.

BRIEF DESCRIPTION OF THE DRAWINGS

FIG. 4a is a further enlarged view of the circled portion of FIG. 4;

FIG. 6 is an enlarged side view similar to that of FIGS. 4 and 5, but with the mold dies abutting against one another in a molding relationship.

DETAILED DESCRIPTION OF THE PREFERRED EMBODIMENT

Figure 1:
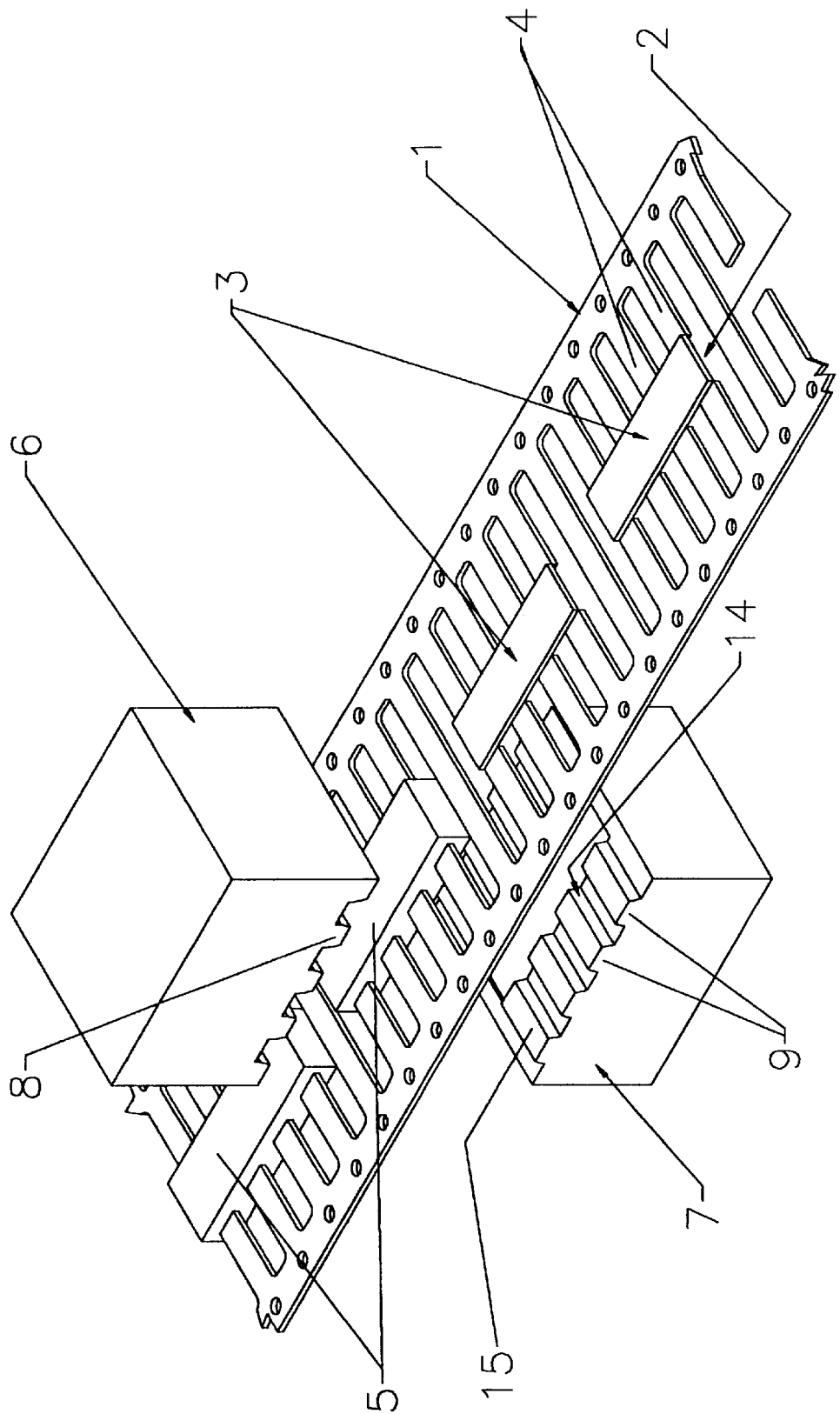
FIG. 1 is an enlarged perspective view of a lead frame interposed between a top mold die and a bottom mold die that form a preferred embodiment of the mold employed by the method of the present invention.

The present invention provides a method using an improved injection mold as shown in FIG. 1 for manufacturing semiconductor integrated circuit devices in connection with a lead frame 1 that has a plurality of apertures 2 for receiving semiconductor chips 3 longitudinally spaced apart on the lead frame 1 at regular intervals. The improved mold of the present invention is formed of a top mold die 6 and a bottom mold die 7 that are specifically designed to encapsulate the chips 3 within a resin housing, as shown at 5 to protect the chips 3 from external impact that may cause damage to their internal circuits. As is well-known in the art, the lead frame 1 includes a plurality of leads 4 that project from the peripheral portion of the frame 1 and connect to electrodes of the chips 3. The inner ends of the leads 4 and the chips 3 are encapsulated in the protective resin in a manner that substantially prevents any leaking or flash of resin from the mold dies 6 and 7. Due to the specific configurations of the dies 6 and 7, the encapsulation molding operation is able to be conducted in a rapid and efficient manner that provides for the proper alignment of the lead frame 1 within the mold during the molding process.

To provide the high speed efficient molding process of the present invention, the mold dies 6 and 7 are formed respectively with opposed teeth 8 and 9. As best shown in FIG. 1, the bottom mold die 7 includes a central depression 12 that serves as one-half of a mold cavity 13, shown only in FIG. 6. The teeth 9 lie on the peripheral edges of the depression 12 and are aligned transversely to such depression to form a series of alternating channels and projections. For a purpose to be described below, the teeth 9 are formed with inclined sidewalls 14 and a flat top surface 15 so that the channels between the teeth 9 are wider at their outer portions than at their inner portions.

Figure 2:
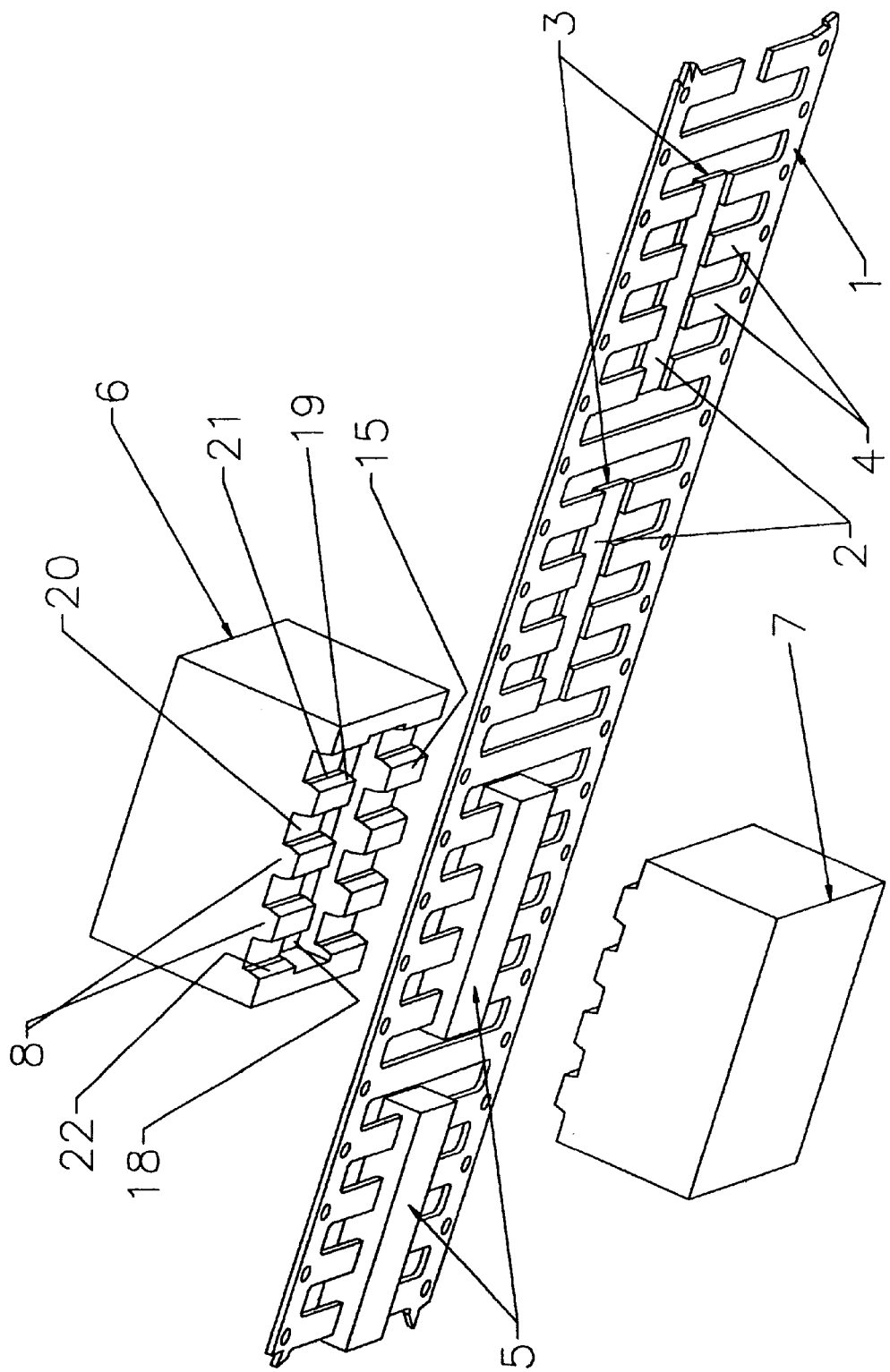
FIG. 2 is a perspective view similar to that of FIG. 1 but shown at a different viewing angle.
Figure 3:
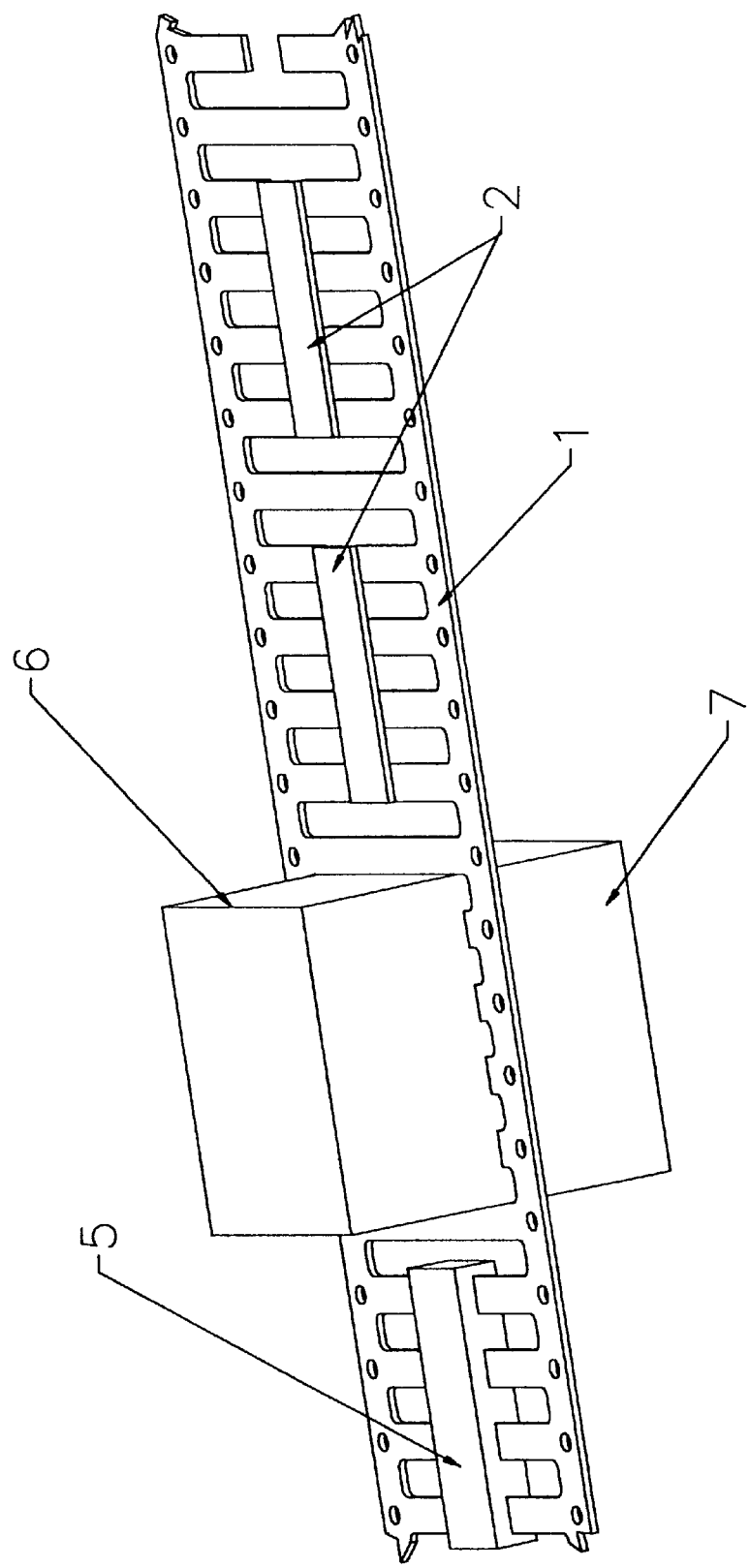
FIG. 3 is yet another perspective view showing the top and bottom mold dies in a molding position with respect to the lead frame.

Referring now to FIG. 2, the mold die 6 also includes a central depression 18 that serves with the depression 12 shown in FIG. 1 to form the mold cavity 13 when the dies 6 and 7 are positioned together during a molding operation as indicated by FIG. 3. The mold teeth 8 of the die 6, similar to the teeth 9, are located on either side of the depression 18 and are spaced apart and aligned transversely to such depression to form a series of alternating channels and projections, with the dies 6 and 7 being positioned with respect to one another so that the projections of one intermate with the channels of the other. The configuration of the teeth 8 on the mold die 6 are somewhat different than that of the teeth 9 as each tooth 8 includes a sidewall 19 formed of a narrow inner strip 20 that is oriented perpendicularly to the lead frame 1 to form a lead enclosure portion 21 having a depth equal to the thickness of the leads 4 and a width equal to that of such leads, and an inclined outer portion 22. Similar to the channels between the teeth 9, the inclined portions 22 of each tooth 8 are inclined toward one another so that the channels formed between two adjacent teeth 8 are wider at their outer portions than their inner portions. The incline pitch of the sidewalls portions 22 preferably corresponds to that of the sidewalls 14 of the teeth 9.

Figure 4:
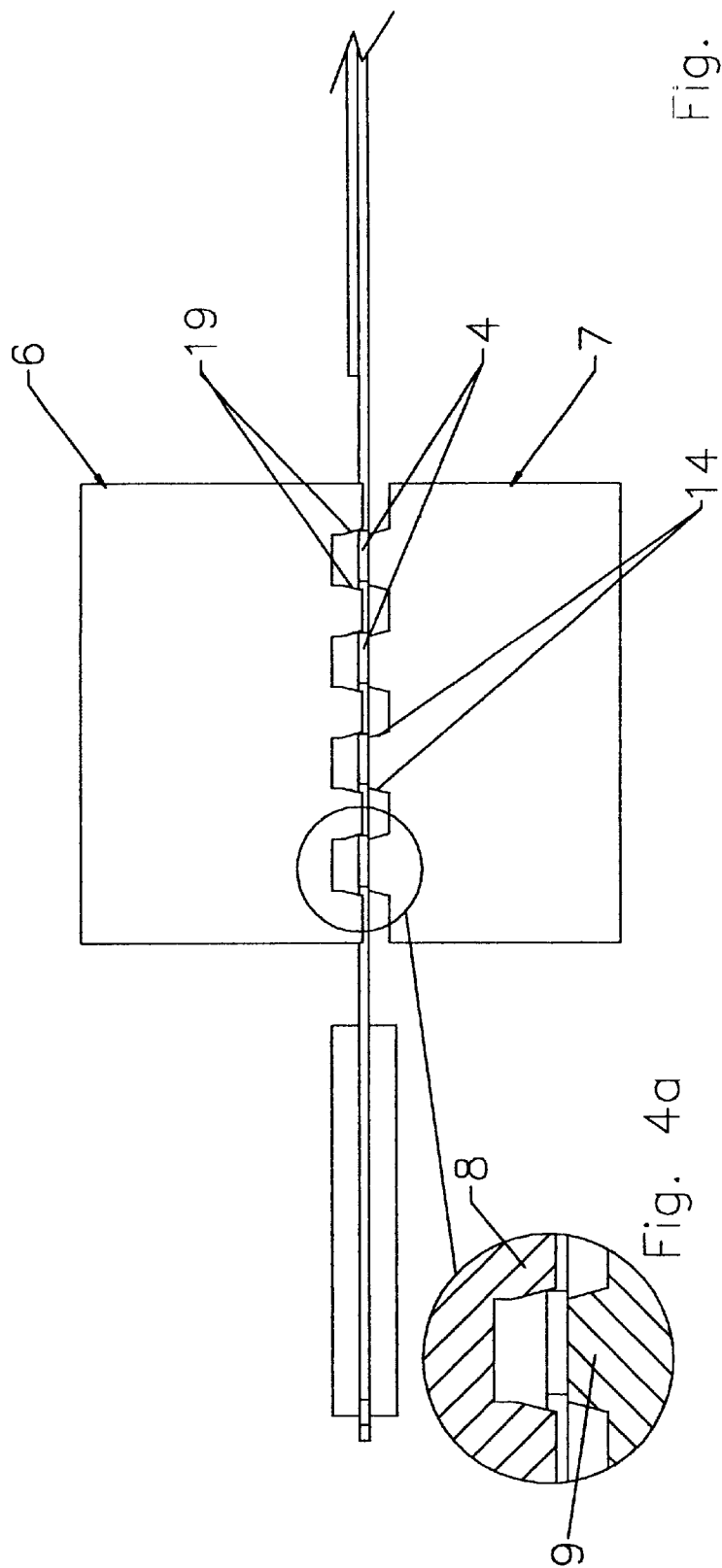
FIG. 4 is an enlarged side view of the top and bottom mold dies of the preferred embodiment as they are brought together with the lead frame.
Figure 5:
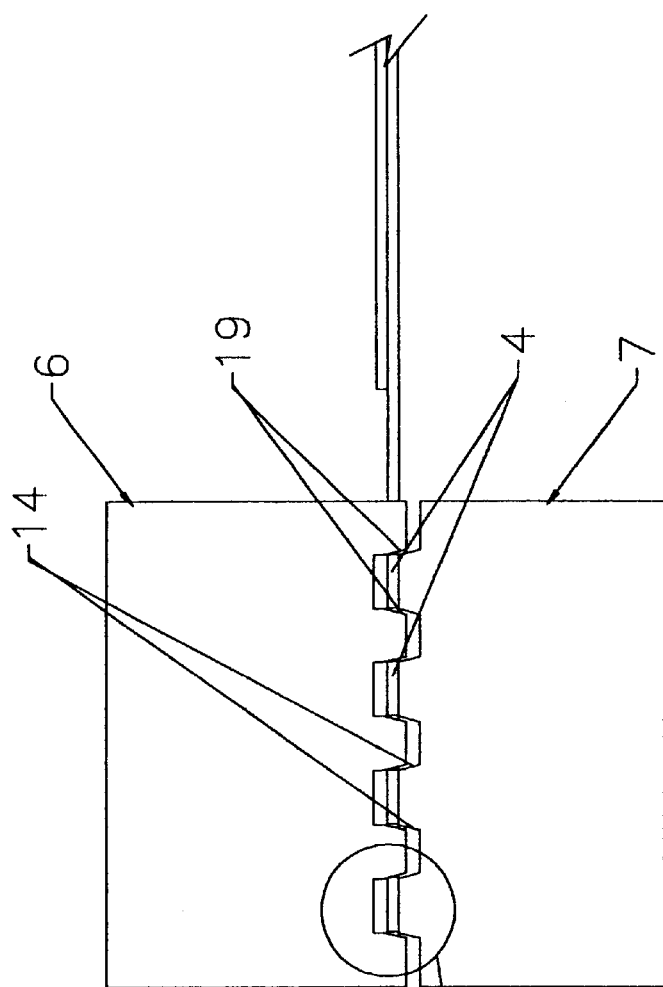
FIG. 5 is an enlarged side view similar to that of FIG. 4 but with the mold dies positioned closer together.

The reason for the use of the inclined sidewalls 14 and 19 respectively of the teeth 9 and 8 is illustrated best by reference to FIGS. 4 and 4a. During the molding operation, it is difficult to provide for a precise alignment of the teeth 8 and 9 with the spaces 2 and leads 4 of the lead frame 1. Thus, as indicated by FIG. 4, at the beginning of the molding process, the leads 4 may be somewhat out of alignment with the teeth 8 and 9. However, as indicated by the sequence shown in FIGS. 4–6, due to the inclined sidewalls 14 and 19 of the teeth 9 and 8, as the mold dies 6 and 7 are brought together, the leads 4 are guided into position into the lead enclosure portions 21 as will now be described.

Figure 5A:
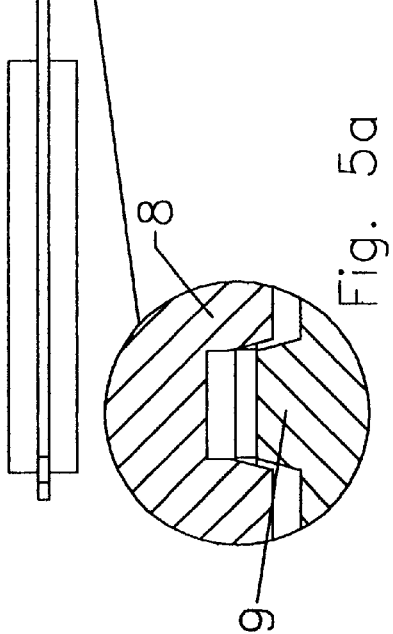
FIG. 5a is a further enlarged view of the circled portion of FIG. 5.

Referring first to FIGS. 4 and 4a, these drawings illustrate how the mold dies 6 and 7 coact to compensate for misalignment of the lead frame 1 therewith. As indicated by FIGS. 4 and 4a, the enlarged openings into the channels between the die teeth 8 insure that the lead frame 1 does not have to be precisely in alignment with the dies 6 and 7 and, as further indicated by FIGS. 5 and 5a, the inclined sidewalls 14 and 19 assist in correcting the misalignment between the lead frame 1 and the mold dies 6 and 7 when they are moved toward one another. Consequently, as indicated by FIGS. 6 and 6a, the leads 4 are moved into the lead enclosure portions 21 between the inner portions of the sidewalls 19, which guiding movement of the leads 4 is accomplished without pinching or other damage to such leads. Thus, with the leads 4 properly positioned within the enclosure portions 21 between the mold dies 6 and 7 and the inclined sidewalls 14 and 19 abutting against one another, the mold die teeth 8 and 9 act to tightly seal the mold cavity 13 with respect to the leads 4 so that as resin is injected into the cavity 13, essentially no leakage of resin or flash occurs during the encapsulation molding process for the IC chip 3.

Although the invention has been described with respect to a preferred embodiment thereof, it is to be understood that it is not to be so limited, since changes and modifications can be made therein, which are within the full intended scope of the invention as defined by the appended claims.

What is claimed is:

1. A method for molding a semi-conductor device with a lead frame having a plurality of side leads comprising the steps of:

(a) providing a top mold having a central depression and a peripheral edge on either side of said depression, each of said peripheral edges having spaced apart teeth aligned transversely to said depression to form a series of alternating channels and projections;

(b) providing a bottom mold having a central depression and a peripheral edge on either side of said depression, each of said peripheral edges having spaced apart teeth aligned transversely to said depression to form a series of alternating channels and projections;

(c) said teeth of one of said top or bottom die being formed with sidewalls, each of said sidewalls having an inner portion that is perpendicular to said lead frame and is sized to equal to the thickness and width of the lead frame leads, and an outer portion that is inclined toward the other sidewall of said tooth so that the inner section of the channel formed between two adjacent teeth is sized to be equal to the width of said leads and the outer section of such channel is larger than said width;

(d) said teeth of the other of said dies being formed with sidewalls that are inclined toward one another and have a pitch that corresponds to the inclined portions of the sidewalls of the other die teeth;

(e) aligning said top and bottom dies so that the projections of one fit into the channels of the other;

(f) placing the lead frame between the dies in such position that the lead frame leads are substantially aligned with the inner section of the channels formed between adjacent teeth of said one die;

(g) bringing the top and bottom dies together so that the teeth of said other die pushes said leads of said lead frame into the channels of said one die in such fashion that the inclined surfaces of the teeth of said die guide the lead frame leads into the inner section of the channels formed between the adjacent teeth of said one die and the molds form a sealed mold cavity that tightly extends around each of said leads when they are brought together; and (h) injecting a molding resin into the die cavity.

2. A method as recited in claim 1, wherein the inclined sidewalls of said teeth of said one die correspond to the inclined portions of the sidewalls of the other die.

3. A method as recited in claim 1, wherein when the top and bottom dies are brought together, the leads of the lead frame are clamped therebetween.

\* \* \* \* \*